United States Patent
Pedersen et al.

(10) Patent No.: US 10,165,377 B2
(45) Date of Patent: Dec. 25, 2018

(54) HEARING DEVICE

(71) Applicant: Oticon A/S, Smørum (DK)

(72) Inventors: Troels Holm Pedersen, Smørum (DK); Claus Tipsmark, Smørum (DK); Michael Frank Petersen, Smørum (DK); Lars Persson, Smørum (DK); Per Lundberg, Smørum (DK); Brian Spidsbjerg, Ballerup (DK); Lars Monroy, Kongens Lyngby (DK)

(73) Assignee: Oticon A/S, Smørum (DK)

( * ) Notice: Subject to any disclaimer, the term of this patent is extended or adjusted under 35 U.S.C. 154(b) by 0 days.

(21) Appl. No.: 15/271,996

(22) Filed: Sep. 21, 2016

(65) Prior Publication Data

US 2017/0086001 A1 Mar. 23, 2017

(30) Foreign Application Priority Data

Sep. 21, 2015 (EP) ..................................... 15185992

(51) Int. Cl.
*H04R 25/00* (2006.01)
*H05K 5/00* (2006.01)
*H05K 7/14* (2006.01)

(52) U.S. Cl.
CPC ......... *H04R 25/608* (2013.01); *H05K 5/0091* (2013.01); *H05K 7/1405* (2013.01); *H05K 7/1427* (2013.01)

(58) Field of Classification Search
CPC ........ H04R 25/00; H04R 25/60; H04R 25/65; H04R 2225/023; H04R 2225/025; H04R 1/105; H04R 2225/021; H04R 2225/63

USPC ................................ 381/322, 324, 328, 330
See application file for complete search history.

(56) References Cited

U.S. PATENT DOCUMENTS

| | | | | |
|---|---|---|---|---|
| 3,239,093 A | * | 3/1966 | Gath | H04R 25/652 381/330 |
| 3,475,566 A | * | 10/1969 | Bauer | H01H 19/62 381/330 |
| 4,354,065 A | * | 10/1982 | Buettner | H04R 25/65 381/322 |
| 4,628,527 A | * | 12/1986 | Henneberger | H01M 2/1044 381/324 |
| 4,783,816 A | * | 11/1988 | Buttner | H04R 25/65 381/330 |
| 4,917,504 A | * | 4/1990 | Scott | H04M 1/05 381/330 |
| 4,922,540 A | | 5/1990 | Erbe | |
| 5,062,138 A | * | 10/1991 | Schmid | H04R 25/602 381/330 |
| 5,201,008 A | | 4/1993 | Arndt et al. | |
| 5,204,917 A | * | 4/1993 | Arndt | H04R 25/608 381/330 |

(Continued)

FOREIGN PATENT DOCUMENTS

WO WO 2009/083007 A2 7/2009

*Primary Examiner* — Suhan Ni
(74) *Attorney, Agent, or Firm* — Birch, Stewart, Kolasch & Birch, LLP

(57) ABSTRACT

A hearing device is disclosed. The hearing device comprises a chassis and a printed circuit board attached to the chassis. The chassis comprises a number of attachment members configured to restrict the motion of the printed circuit board in one or more directions. The attachment members are integrated parts of the chassis.

12 Claims, 6 Drawing Sheets

(56) References Cited

U.S. PATENT DOCUMENTS

| | | | | |
|---|---|---|---|---|
| 5,265,168 | A | * | 11/1993 | Schiess ............... H04R 25/608 381/330 |
| 5,708,720 | A | * | 1/1998 | Meyer .................... H04R 25/00 381/330 |
| 5,967,837 | A | | 10/1999 | Wolfe et al. |
| 6,041,128 | A | * | 3/2000 | Narisawa ............ H04R 25/602 381/330 |
| 6,522,764 | B1 | * | 2/2003 | Bøgeskov-Jensen .. H04R 25/60 381/330 |
| 6,658,125 | B1 | * | 12/2003 | Batting ............... H04R 25/602 381/330 |
| 6,700,983 | B1 | * | 3/2004 | Bøgeskov-Jensen .. H04R 25/60 381/330 |
| 6,735,319 | B1 | * | 5/2004 | Vonlanthen ........... H04R 25/60 381/330 |
| 6,748,094 | B1 | * | 6/2004 | Tziviskos ............. H04R 25/60 381/322 |
| 7,742,613 | B2 | * | 6/2010 | Dittli ...................... H04R 25/65 381/330 |
| 7,844,065 | B2 | * | 11/2010 | von Dombrowski .. H04R 25/48 381/328 |
| 2008/0232626 | A1 | | 9/2008 | Ho et al. |
| 2011/0158443 | A1 | | 6/2011 | Åsnes et al. |

* cited by examiner

PRIOR ART
FIG. 1A
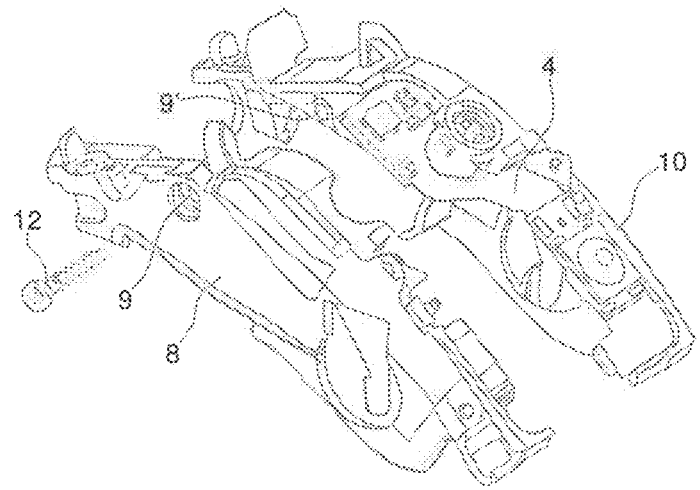
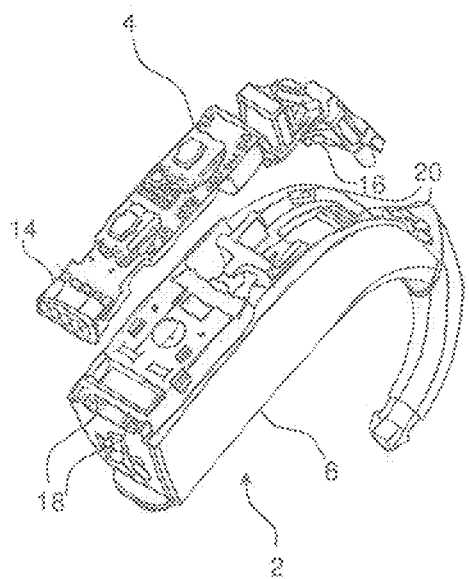
FIG. 1B
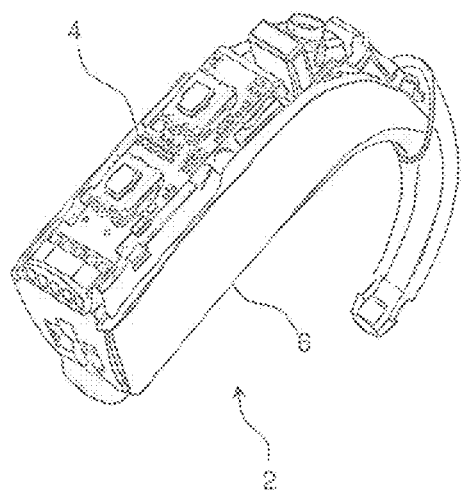
FIG. 1C

FIG. 6A
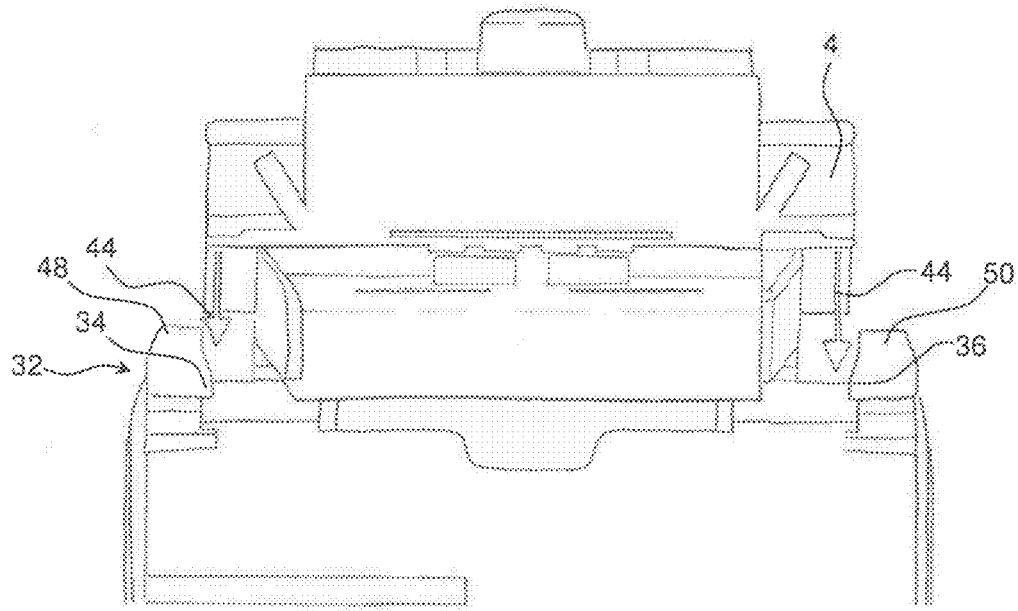
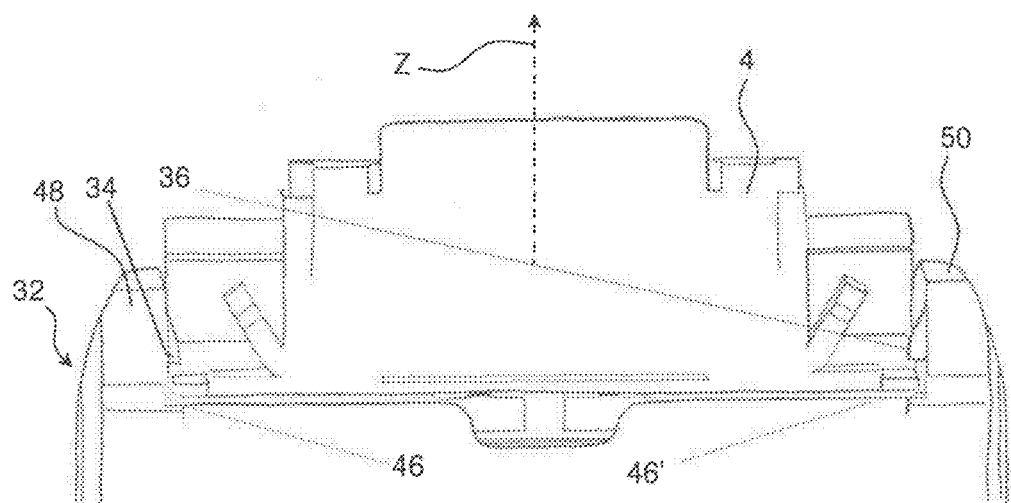
FIG. 6B

HEARING DEVICE

FIELD

The present disclosure relates to a hearing device having a printed circuit board. More particularly, the disclosure relates to a hearing device equipped with features for holding a printed circuit board in position in the hearing device.

BACKGROUND

Modern hearing devices are typically provided with a printed circuit board that needs to be kept in position in order to withstand daily use, handling, drops and furthermore to allow for assembling the hearing device.

The printed circuit board is typically attached to the hearing device by a holding arrangement in which the printed circuit board is arranged between two parts that are either held together by screws or pressed around the printed circuit board. Alternatively, the printed circuit board can be soldered to the parts holding it in position (e.g. battery terminals).

These known solutions require either several parts to be screwed together or pressed around the printed circuit board or a complex attachment method.

Therefore, there is a need to provide a solution that allows for an easier way of attaching a printed circuit board to a hearing device. The present disclosure provides at least an alternative to the prior art.

SUMMARY

According to an aspect, the hearing device is a hearing device comprising a chassis and a printed circuit board attached to the chassis, wherein the chassis comprises a number of attachment members configured to restrict the motion of the printed circuit board in one or more directions, wherein the attachment members are integrated parts of the chassis.

Hereby, it is possible to achieve an easier way of attaching a printed circuit board to a hearing device. Moreover, the requirements of several separated structures that need to be screwed together or pressed together to keep the printed circuit board fixed is eliminated.

The hearing device comprises a chassis and a printed circuit board attached to the chassis. The chassis may have any suitable form and size and may preferably be basically symmetrical about a center plane of the chassis. The chassis may at least be symmetrical about the center plane where the printed circuit board is to be positioned.

The chassis comprises a number of attachment members configured to restrict the motion of the printed circuit board in one or more directions. It is preferred that the attachment members are configured to restrict the motion of the printed circuit board in several directions. It is particularly preferred that the attachment members are configured to restrict the motion of the printed circuit board in several independent directions, preferably in three independent directions.

The attachment members are integrated parts of the chassis, and the attachment members may be shaped as structures protruding from the remaining portion of the chassis.

The printed circuit board may be a flexible printed circuit board.

By applying a flexible printed circuit board, it is possible to deform the printed circuit board during the attachment of the printed circuit board to the hearing device. The deformation preferably being elastic.

The use of a flexible printed circuit board may be an advantage in hearing devices where many interconnections are required in a compact package.

The chassis may be a one-piece body. Alternatively, the chassis may be assembled from two pieces, where one piece is a sidewall of the chassis.

Hereby, the production cost and assembling time may be reduced. A more compact construction can be provided since fewer space-requiring interface surfaces are needed. Moreover, fewer interface surfaces need to transfer force. Besides, the tolerance chains get shorter and allow for providing more reliable and cheaper parts.

The attachment members of the first type may be formed as snap members. The snapping here includes that the printed circuit board is to be pressed down so that the printed circuit board snaps into place beneath the first type attachment member. Hereby, it is possible to provide an easy and quick attachment of the printed circuit board to the chassis. The snap members may be integrated parts protruding from the remaining portion of the chassis. The snap member may be formed so that the printed circuit board may be inserted from above, and the snap member is formed so as to prevent printed circuit board movement upwards, i.e. the snap member prevent movement in the direction opposite of the direction that the printed circuit board is mounted in, at least during normal use.

The chassis may comprise a first type of attachment members configured to prevent the printed circuit board to be moved in a direction basically perpendicular to the printed circuit board.

Hereby, the printed circuit board can be restricted from being moved in a direction basically perpendicular to the printed circuit board by the first type of attachment members.

The chassis may comprise two or more of the first type of attachment members. Hereby, the printed circuit board can be firmly fixed to the chassis and be restricted from being moved in a direction basically perpendicular to the printed circuit.

The chassis may comprise four or more of the first type of attachment members. Hereby, the attachment members can attach the printed circuit board at four or more positions. Thus, a secure attachment of the printed circuit board to the chassis can be achieved.

The chassis may, additionally or alternatively, comprise a second type of attachment members configured to prevent the printed circuit board from being moved in directions parallel to the printed circuit board. This means that the printed circuit board is prevented, or limited, in moving along, or parallel to, a plane formed by the printed circuit board. Hereby, motion of the printed circuit board in directions parallel to the printed circuit board can be avoided. Accordingly, a firm attachment can be achieved by utilizing the second type of attachment members. The second type could be a protrusion of a wall element, e.g. a smooth shaped protrusion The chassis may comprise one, two or more of the second type of attachment members. Hereby, a reliable and secure attachment of the printed circuit board can be achieved.

By combining the two types of attachment members, motion or displacement of the printed circuit board may be avoided or at least minimized, e.g. when a hearing aid having such an arrangement is moved during use or e.g. dropped by accident.

Further, the second type of attachment member may function as a guide for the printed circuit board when being mounted, e.g. the second type attachment member could extend along the height of the receptacle formed in the chassis where the printed circuit board is to be positioned, and one, two or more of the first type of attachment members may be formed lower in the receptacle, so that when assembling the printed circuit board in the chassis, the second type attachment member or members guide the printed circuit board while the printed circuit board travels towards the bottom of the receptacle.

The printed circuit board may comprise one or more deformable areas or portions configured to be deformed during attachment of the printed circuit board. The deformable areas of the printed circuit board enable an easy attachment of the printed circuit board to the chassis. The deformable areas of the printed circuit board allow for deformation that makes it possible to arrange the printed circuit board in a position in which it is kept in place by the attachment members of the chassis.

The chassis may comprise a first wall structure provided along one side of the chassis and a second wall structure extending along the opposite side of the chassis. The wall structures define areas in which the attachment members may be provided. Accordingly, the size of the chassis relative to the size of the printed circuit board may be minimised.

The attachment members may protrude from the first wall structure and extend radially inwardly towards the center plane of the chassis. Hereby, the attachment members can restrict the motion of the printed circuit board in directions basically perpendicular to the printed circuit board. A protruding part may extend into a mating opening in a side of the printed circuit board. If several protruding parts are present, a corresponding number of openings in one or more sides of the printed circuit board should be present. The openings may be distributed between the sides, so as, e.g. one, two, three or more protrusions are present at each of two opposite (possibly parallel) sides of the printed circuit board. This could e.g. include the printed circuit board having an oblong geometry, and two protrusions are arranged at two opposite sides of the chassis and two corresponding openings, or indentations, are formed in the two long sides of the printed circuit board, this would prevent movement of the printed circuit board in a direction parallel with the longitudinal axis of the printed circuit board. Likewise one, two, three or more protrusions could be present at the two short sides of the printed circuit board.

The printed circuit board may have a geometry other than square or rectangular. Protrusions could be present are multiple locations along the periphery of the printed circuit board to prevent movement parallel to the surface of the printed circuit board. If the printed circuit board is no flat, movement could be restricted at least in a direction parallel to a side of the printed circuit board.

Moreover, the edge of the printed circuit board may be brought into contact with the attachment members during attachment of the printed circuit board.

The attachment members may protrude from the second wall structure and extend radially inwardly towards the center plane of the chassis. Accordingly, the attachment members are capable of restricting the motion of the printed circuit board in directions basically perpendicular to the printed circuit board.

Besides, the edge of the printed circuit board may be brought into contact with the attachment members during attachment of the printed circuit board.

The chassis may be dimensioned and shaped to allow the printed circuit board to be provided in a distance from the attachment members so that a gap can be provided between the printed circuit board and the attachment members.

Hereby, it is possible to allow engineering tolerances with respect to the size of the chassis and the printed circuit board. Thus, the production and assembling of the hearing device can be eased and the production cost can be reduced.

BRIEF DESCRIPTION OF DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effects will be apparent from and elucidated with reference to the illustrations described hereinafter in which:

FIG. 1A shows a perspective view of a prior art hearing device two-part chassis;

FIG. 1B shows a prior art hearing device and a printed circuit board being attached;

FIG. 1C shows the prior art hearing device shown in FIG. 1B when the printed circuit board has been attached;

FIG. 6A shows a side view of a chassis and a printed circuit board, wherein the printed circuit board is being attached to the chassis and FIG. 6B shows a side view of the chassis and the printed circuit board shown in FIG. 6A, wherein the printed circuit board has been attached to the chassis.

DETAILED DESCRIPTION

Figure 2B:
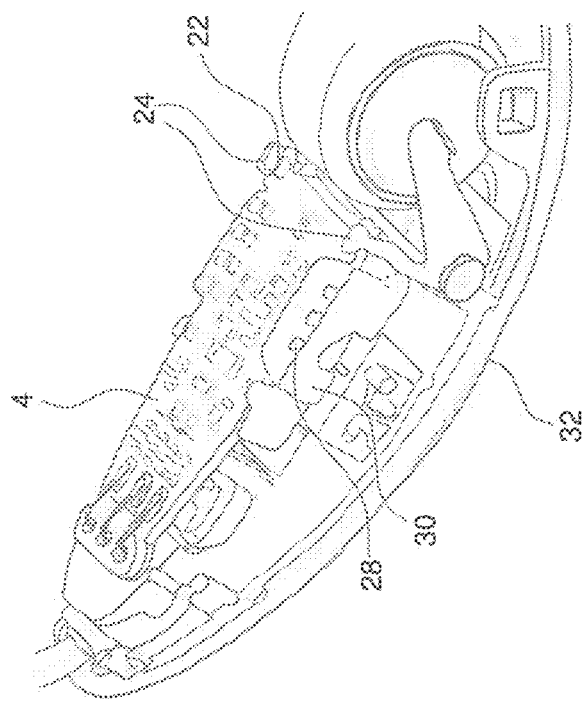
FIG. 2B shows the prior art hearing device shown in FIG. 2A with the printed circuit board being attached.

The detailed description set forth below in connection with the appended drawings is intended as a description of various configurations. The detailed description includes specific details for the purpose of providing a thorough understanding of various concepts. However, it will be apparent to those skilled in the art that these concepts may be practiced without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer programs, or any combination thereof.

The printed circuit board may comprise any suitable electronic hardware including microprocessors, microcontrollers, digital signal processors (DSPs), field programmable gate arrays (FPGAs), programmable logic devices (PLDs), gated logic, discrete hardware circuits, and other suitable hardware configured to perform the various functionality described throughout this disclosure. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

A hearing device may include a hearing aid that is adapted to improve or augment the hearing capability of a user by receiving an acoustic signal from a user's surroundings, generating a corresponding audio signal, possibly modifying the audio signal and providing the possibly modified audio signal as an audible signal to at least one of the user's ears. The "hearing device" may further refer to a device such as an earphone or a headset adapted to receive an audio signal electronically, possibly modifying the audio signal and providing the possibly modified audio signal as an audible signal to at least one of the user's ears. Such audible signals may be provided in the form of an acoustic signal radiated into the user's outer ear, or an acoustic signal transferred as mechanical vibrations to the user's inner ear through bone structure of the user's head and/or through parts of the middle ear of the user or electric signals transferred directly or indirectly to the cochlear nerve and/or to the auditory cortex of the user.

The hearing device is adapted to be worn in any known way. This may include i) arranging a unit of the hearing device behind the ear with a tube leading air-borne acoustic signals into the ear canal or with a receiver/loudspeaker arranged close to or in the ear canal such as in a Behind-the-Ear type hearing aid, and/or ii) arranging the hearing device entirely or partly in the pinna and/or in the ear canal of the user such as in a In-the-Ear type hearing aid or In-the-Canal/Completely-in-Canal type hearing aid, or iii) arranging a unit of the hearing device attached to a fixture implanted into the skull bone such as in Bone Anchored Hearing Aid or Cochlear Implant, or iv) arranging a unit of the hearing device as an entirely or partly implanted unit such as in a Bone Anchored Hearing Aid or a Cochlear Implant.

A "hearing system" refers to a system comprising one or two hearing devices, and a "binaural hearing system" refers to a system comprising two hearing devices where the devices are adapted to cooperatively provide audible signals to both of the user's ears. The hearing system or binaural hearing system may further include an auxiliary device(s) that communicates with at least one hearing device, the auxiliary device affecting the operation of the hearing devices and/or benefitting from the functioning of the hearing devices. A wired or wireless communication link between the at least one hearing device and the auxiliary device is established that allows for exchanging information (e.g. control and status signals, possibly audio signals) between the at least one hearing device and the auxiliary device. Such auxiliary devices may include at least one of the following: remote controls, remote microphones, audio gateway devices, mobile phones, public-address systems, car audio systems or music players or a combination thereof. The audio gateway is adapted to receive a multitude of audio signals such as from an entertainment device like a TV or a music player, a telephone apparatus like a mobile telephone or a computer, a PC. The audio gateway is further adapted to select and/or combine an appropriate one of the received audio signals (or combination of signals) for transmission to the at least one hearing device. The remote control is adapted to control functionality and operation of the at least one hearing devices. The function of the remote control may be implemented in a SmartPhone or in another electronic device, the SmartPhone/electronic device possibly running an application that controls functionality of the at least one hearing device.

In general, a hearing device includes i) an input unit such as a microphone for receiving an acoustic signal from a user's surroundings and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal.

The input unit may include multiple input microphones, e.g. for providing direction-dependent audio signal processing. Such a directional microphone system is adapted to enhance a target acoustic source among a multitude of acoustic sources in the user's environment. In one aspect, the directional system is adapted to detect (such as adaptively detect) from which direction a particular part of the microphone signal originates. This may be achieved by using conventionally known methods. The signal processing unit may include an amplifier that is adapted to apply a frequency dependent gain to the input audio signal. The signal processing unit may further be adapted to provide other relevant functionality such as compression, noise reduction, etc. The output unit may include an output transducer such as a loudspeaker/receiver for providing an air-borne acoustic signal transcutaneously or percutaneously to the skull bone or a vibrator for providing a structure-borne or liquid-borne acoustic signal. In some hearing devices, the output unit may include one or more output electrodes for providing the electric signals such as in a Cochlear Implant.

Now referring to FIG. 1A which illustrates a perspective view of a prior art hearing device two-part chassis. FIG. 1A illustrates an example of a prior art hearing device chassis having a first member 8 and a second member 10 configured to be screwed, i.e. assembled and held, together by a screw 12. The screw 12 is configured to be inserted into a through bore 9 provided in the first member and to be further engagingly received by a threaded bore 9' provided in the second member 10.

By screwing the first member 8 and the second member 10 together, a printed circuit board 4 is being attached to the chassis. This procedure is time consuming, and furthermore the need of two separate chassis members 8, 10 reduces the production cost. Accordingly, it would be beneficial to have an alternative to this way of attaching a printed circuit board to a chassis of a hearing device.

FIG. 1B illustrates a prior art hearing device 2 and a printed circuit board 4 being attached to the hearing device 2. The hearing device 2 comprises a housing 6 in which a chassis is arranged. The chassis comprises first receiving portions 18 and second receiving portions 20.

The printed circuit board 4 comprises a separate attachment member 14 configured to be inserted into the first receiving portions 18. The printed circuit board 4 further comprises an attachment structure 16 configured to be engagely received by the second receiving portions 20.

FIG. 1C illustrates the prior art hearing device 2 shown in FIG. 1B in a configuration in which the printed circuit board 4 has been attached to the chassis arranged in the housing 6.

Figure 2A:
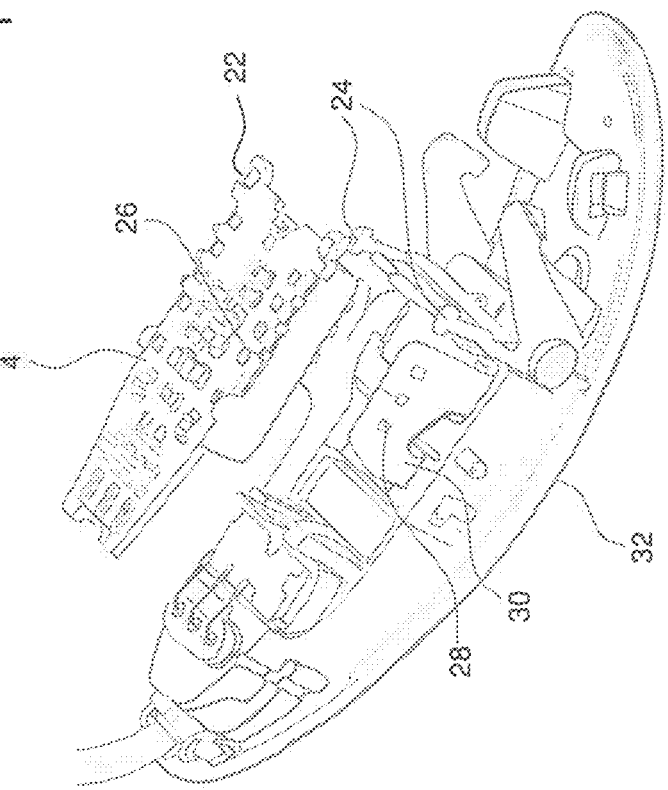
FIG. 2A shows a prior art hearing device with a printed circuit board being attached.

FIG. 2A illustrates a prior art hearing device with a printed circuit board 4 being attached to a chassis 32. The deformable structure 30 is provided with holes 28 configured to receive corresponding rod members 26 provided on a structure attached to the printed circuit board 4. The chassis 32 moreover comprises two attachment members 24 arranged to be received by corresponding receiving structures 22 provided on the printed circuit board 4.

FIG. 2B illustrates the prior art hearing device shown in FIG. 2A in a configuration in which the printed circuit board 4 is attached to the chassis 32.

The use of the deformable structure 30, rod members 26, attachment members 24 and receiving structures 22 is a complex and expensive solution. Accordingly, it would be advantageous to have an alternative to this prior art solution.

Figure 3:
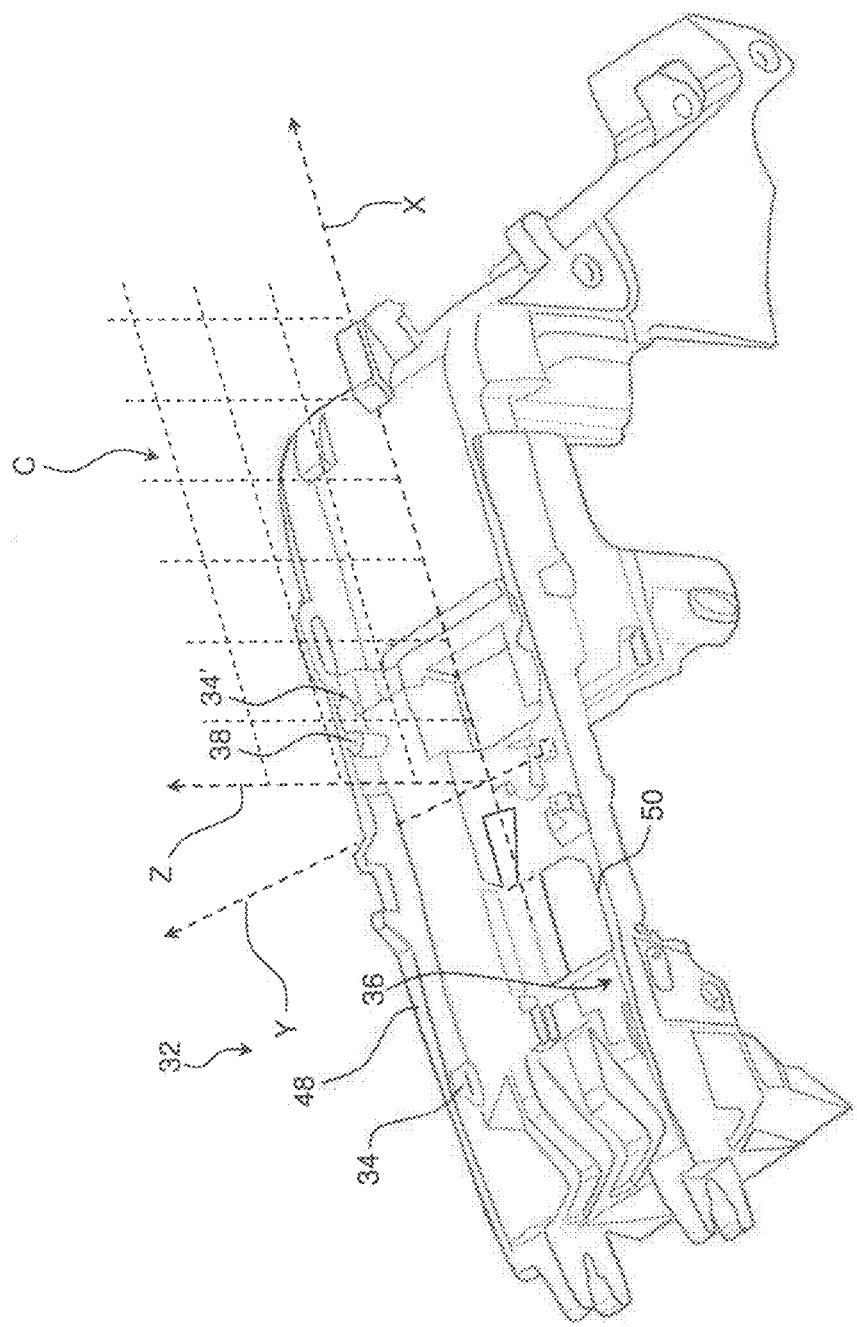
FIG. 3 shows a perspective view of a chassis.

FIG. 3 illustrates a perspective view of a chassis 32. The chassis 32 comprises a first wall structure 48 protruding from the adjacent portion of the chassis 32. The chassis 32 further comprises a second wall structure 50 protruding from the adjacent portion of the chassis 32.

The chassis 32 comprises a longitudinal axis X, a lateral axis Y, and a transversal axis Z. The chassis 32 further comprises a center plane C spanned by the longitudinal axis X and the transversal axis Z. The chassis 32 is almost symmetrical about the center plane C.

The chassis 32 comprises a first type of attachment members 34, 34', 36 configured to preventing a printed circuit board to be moved in a direction, basically, perpendicular to the printed circuit board, which is along the Z-axis of the chassis 32. Here three of the first type of attachment members are pointed to in the Figure, however, generally, a chassis as disclosed herein for carrying a printed circuit board in a hearing aid may include a number of such first type of attachment members.

The chassis 32 further comprises a second type of attachment members 38, 38' configured to prevent a printed circuit board to be moved in a direction basically parallel to the printed circuit board, which is along the longitudinal axis X or the lateral axis Y or linear combinations thereof. Accordingly, a firm attachment can be achieved by utilizing the second type of attachment members 38. Here two of the first type of attachment members are illustrated in the Figure, however, generally, a chassis as disclosed herein for carrying a printed circuit board in a hearing aid may include a different number of such second type of attachment members, and the number of first and second type of attachment members may be chosen in dependence of each other for maximizing retention of the printed circuit board while taking into account the size restrictions and other requirements, such as weight.

The chassis 32 comprises a plurality of the first type of attachment members 34, 34'. This allows the printed circuit board to be firmly fixed to the chassis 32 and restricts the printed circuit board from being moved in a direction basically perpendicular to the printed circuit board. The first type of attachment members 34, 34' allow the printed circuit board to be snapped into place so that the attachment members 34, 34' restrict the upwards motion of the printed circuit board 4, i.e. along the z-axis as illustrated in FIG. 3.

It can be seen that the first type of attachment members 34, 34' protrude from the first wall structure 48 and extend radially inwardly towards the center plane C of the chassis 32. A distance between the first type of attachment member 34, 34' and the bottom of the cavity formed in the chassis 32 where the printed circuit board 4 is to be placed. When in place the printed circuit board 4 will be between the attachment member 34, 34' and the chassis floor or bottom.

Furthermore, a plurality of a first type of attachment members 36 protrude from the second wall structure 50 and extend radially inwardly towards the center plane C of the chassis 32.

The combination of utilizing both the first type and the second type attachment members is advantageous in that they keep the printed circuit board in the intended position in the chassis.

Figure 4:
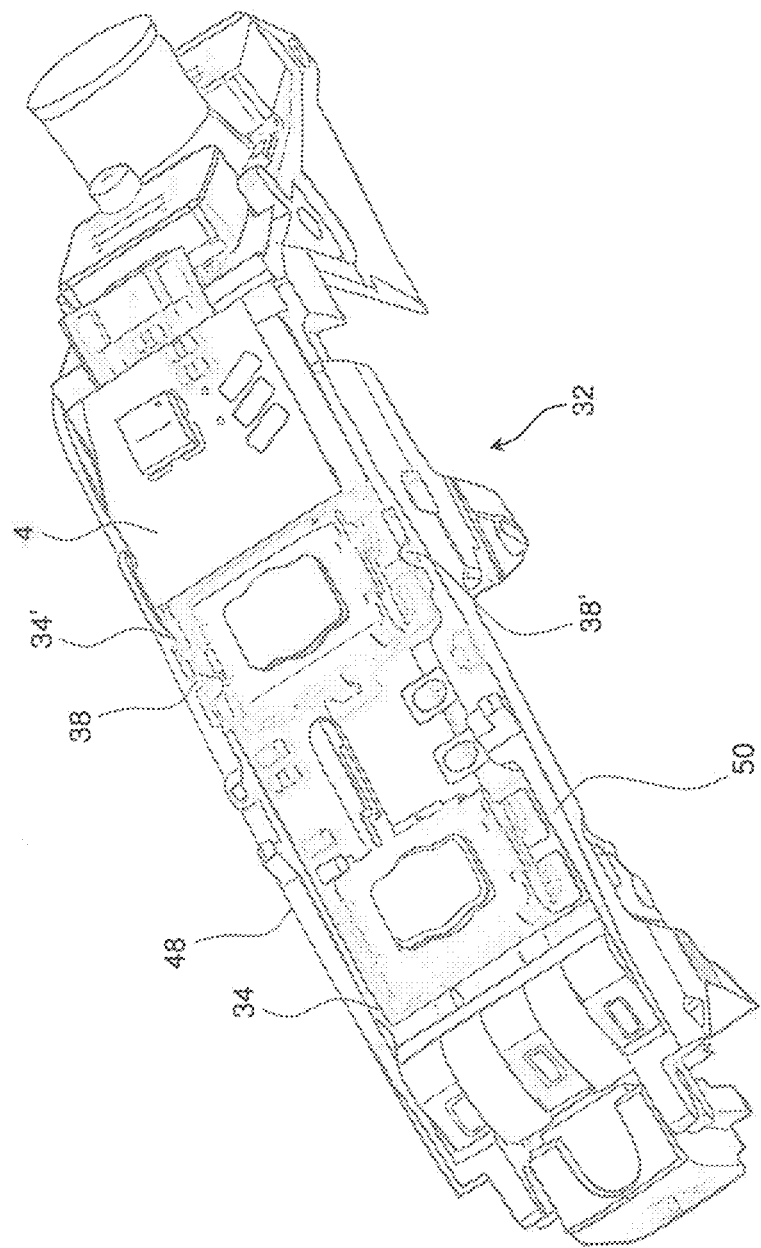
FIG. 4 shows a perspective top view of the chassis shown in FIG. 3, wherein the printed circuit board has been attached.

FIG. 4 illustrates a perspective top view of the chassis 32 shown in FIG. 3.A, a printed circuit board 4 has been attached to the chassis 32 by utilizing the first type of attachment members 34, 34' and the second type of attachment members 38, 38'.

The printed circuit board 4 is a flexible printed circuit board 4 configured to be deformed in order to attach the printed circuit board 4 to the chassis 32 by utilizing the attachment members 34, 34', 36, 38, 38' protruding from the first wall structure 48 and the second wall structure 50, respectively. As is seen in FIG. 4 the second type attachment members 38, 38' are shaped as smooth protrusions extending from the floor of the space where the printed circuit board is to be located and upwards therefrom at a sidewall of the chassis 32.

Figure 5:
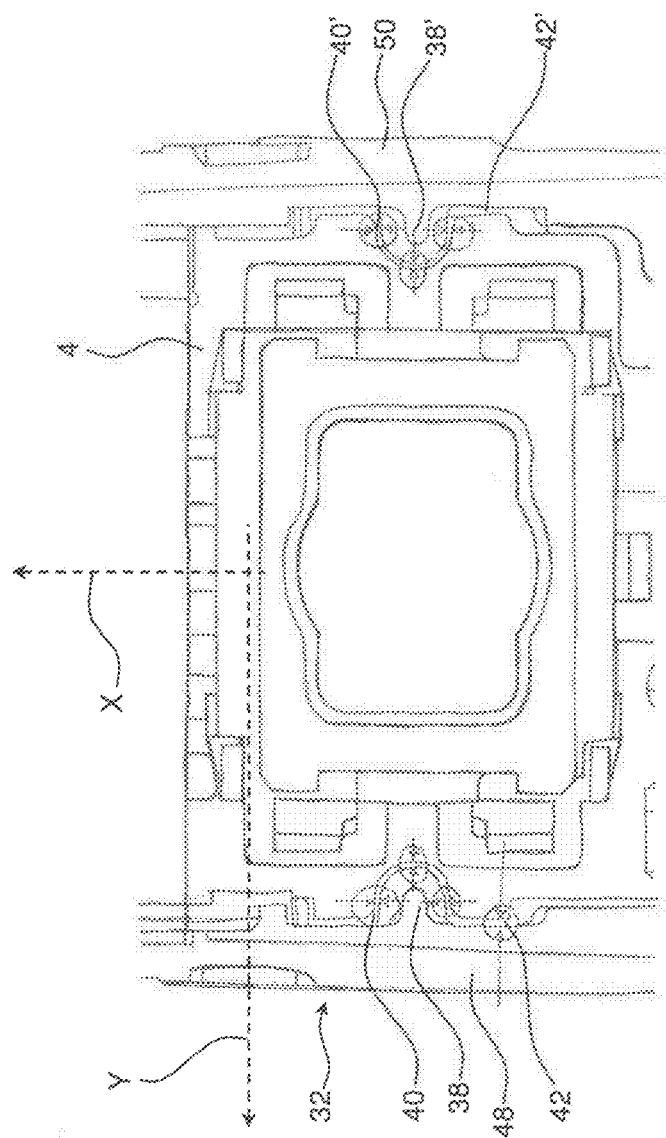
FIG. 5 shows a top view of a chassis and a printed circuit board, wherein the printed circuit board is attached to the chassis.

FIG. 5 illustrates a top view of a chassis 32 and a printed circuit board 4, wherein the printed circuit board 4 is attached to the chassis 32. It can be seen that a first gap 40 is provided between the printed circuit board 4 and the second type of attachment member 38 at the first wall structure 48. Likewise, a second gap 40' is provided between the printed circuit board 4 and the second type of attachment member 38' at the second wall structure 50.

The second type of attachment member 38 at the first wall structure 48 and the second type of attachment member 38' at the second wall structure 50 restrict movement of the printed circuit board 4 along the longitudinal axis X and along the lateral axis Y and thus in directions parallel to the printed circuit board 4.

Furthermore, it can be seen that a first gap 42 is provided between the printed circuit board 4 and the first type of attachment member at the first wall structure 48. Likewise, a second gap 42' is provided between the printed circuit board 4 and the first type of attachment member at the second wall structure 50.

The first type of attachment members (see FIG. 6) at the first wall structure 48 and at the second wall structure 50 restrict movement of the printed circuit board 4 in directions perpendicular to the printed circuit board 4.

FIG. 6A illustrates a side view of a chassis 32 and a printed circuit board 4. The printed circuit board 4 is being attached to the chassis 32 by being moved in the direction indicated by the arrows 44. The chassis 32 comprises a first wall structure 48 and an attachment member 34 protruding therefrom. Likewise, the chassis 32 comprises a second wall structure 50 and an attachment member 36 protruding therefrom.

FIG. 6B illustrates a side view of the chassis 32 and the printed circuit board 4 shown in FIG. 6A. The printed circuit board 4 has been attached to the chassis 32 and thus the printed circuit board 4 is fixed to the chassis 32. The printed circuit board 4 is restricted from being moved along the transversal axis Z of the chassis 32.

The printed circuit board 4 comprises a first deformable portion 46 and a second deformable portion 46' provided at the peripheral portions of the printed circuit board 4. The deformable portions 46, 46' make it easier to attach the printed circuit board 4 to the chassis 32 and to "pass" the attachment members 34, 36. The deformable portions are elastically deformable meaning that they obtain a geometry substantially identical to their original geometry after the deformation process.

As used, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element, but an intervening elements may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method is not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follow.

LIST OF REFERENCE NUMERALS

2 Hearing device
4 Printed circuit board
6 Housing
8 First member
9 Through bore
9' Threaded bore
10 Second member
12 Screw
14 Attachment member
16 Attachment structure
18, 20 Receiving portion
22 Receiving structure
24 Attachment member
26 Rod member
28 Hole
30 Deformable structure
32 Chassis
34, 34' Attachment member
36 Attachment member
38, 38' Attachment member
40, 40' Gap
42, 42' Gap
44 Direction
46, 46' Deformable portion
48 Wall structure
50 Wall structure
52, 54 Side portion
X, Y, Z Axis
C Center plane

The invention claimed is:

1. A hearing aid device having a housing configured to be arranged behind the ear of a user with a tube leading air-borne acoustic signals into the ear canal or with a receiver/loudspeaker arranged close to or into the ear canal, the hearing aid device comprising a chassis arranged in the housing and a printed circuit board attached to the chassis arranged in the housing, wherein the chassis comprises:
a floor structure with a surface on top of which the printed circuit board is laid when attached, such that the floor structure is substantially coplanar with the attached printed circuit board, and a Z-axis of the chassis extends substantially perpendicular to the surfaces of the floor structure and the attached printed circuit board;
a first wall structure extending on one side of the floor structure along an X-axis of the chassis, and a second wall structure extending on the opposite side of the floor structure along the X-axis, the first and second wall structures being substantially perpendicular to the floor structure;
an attachment member of a first type protruding from at least one of the first and second wall structures so as to be positioned above the surface of the attached printed circuit board in such manner that the attached printed circuit board is sandwiched between the attachment member of the first type and the floor structure, thus restricting motion of the attached printed circuit board in a direction of the Z-axis; and
an attachment member of a second type protruding from at least one of the first and second wall structures toward a lateral side of the attached printed circuit board to restrict motion of the attached printed circuit board in a direction of a Y-axis of the chassis,
wherein the attachment members of the first and second types are integrated parts of the first and second wall structures of the chassis.

2. The hearing aid device according to claim 1, wherein the attachment member of the first type is formed as a snap member configured to make the printed circuit board snap into place between the attachment member of the first type and the floor structure when attached to the chassis.

3. The hearing aid device according to claim 2, wherein the printed circuit board comprises one or more deformable areas configured to be deformed during attachment of the printed circuit board.

4. The hearing aid device according to claim 1, wherein the chassis comprises two, three, four or more of the first type of attachment members.

5. The hearing aid device according to claim 1, wherein the chassis comprises two, three, four or more of the second type of attachment members.

6. The hearing aid device according to claim 1, wherein the printed circuit board comprises one or more deformable areas configured to be deformed during attachment of the printed circuit board.

7. The hearing aid device according to claim 1, wherein the attachment member of the first type protrudes from the first wall structure and extends radially inwardly towards the center plane of the chassis and/or wherein the attachment member of the first type protrudes from the second wall structure and extends radially inwardly towards the center plane of the chassis.

8. The hearing aid device according to claim 1, wherein the attachment member of the second type protrudes from the second wall structure and extends radially inwardly towards the center plane of the chassis and/or wherein the attachment member of the second type protrudes from the first wall structure and extends radially inwardly towards the center plane of the chassis.

9. The hearing aid device according to claim 8, wherein the first and/or second wall structure together with the floor structure forms part of a cavity wherein the printed circuit board is to be held when attached, and the attachment member of the second type extends along the first and/or second wall structure from the floor structure and beyond the point where the printed circuit board is to be held.

10. The hearing aid device according to claim 9, wherein a point where the printed circuit board is to be held is defined by the attachment member of the first type.

11. The hearing aid device according to claim 1, wherein the chassis is dimensioned and shaped to allow the attached printed circuit board to be provided in a distance from the attachment members so that a gap can be provided between the attached printed circuit board and the attachment members.

12. The hearing aid device according to claim 1, wherein the chassis is a one-piece body or a multi-component body.

* * * * *